United States Patent
Amato et al.

(10) Patent No.: US 8,611,056 B2
(45) Date of Patent: Dec. 17, 2013

(54) SUPERCONDUCTING FAULT CURRENT LIMITER

(75) Inventors: Mark R. Amato, Bedford, MA (US); Paul J. Murphy, Reading, MA (US); James D. Strassner, Austin, TX (US)

(73) Assignee: Varian Semiconductor Equipment Associates Inc., Gloucester, MA (US)

( * ) Notice: Subject to any disclaimer, the term of this patent is extended or adjusted under 35 U.S.C. 154(b) by 0 days.

(21) Appl. No.: 13/415,976

(22) Filed: Mar. 9, 2012

(65) Prior Publication Data

US 2012/0257313 A1    Oct. 11, 2012

Related U.S. Application Data

(60) Provisional application No. 61/452,398, filed on Mar. 14, 2011.

(51) Int. Cl.
    *H01L 39/00* (2006.01)
(52) U.S. Cl.
    USPC .............................. 361/19; 505/150
(58) Field of Classification Search
    USPC .............................. 361/19; 505/150
    See application file for complete search history.

(56) References Cited

U.S. PATENT DOCUMENTS

| | | | |
|---|---|---|---|
| 6,900,714 B1 * | 5/2005 | Huang et al. | 335/216 |
| 2006/0122067 A1 * | 6/2006 | Holcomb | 505/124 |
| 2011/0026170 A1 | 2/2011 | Husband et al. | |

FOREIGN PATENT DOCUMENTS

| | | |
|---|---|---|
| DE | 19750760 A1 | 5/1999 |
| GB | 2332558 A | 6/1999 |
| WO | 9630990 A1 | 10/1996 |

\* cited by examiner

*Primary Examiner* — Danny Nguyen

(57) ABSTRACT

A superconducting fault current limiter (SCFCL) includes a cryogenic tank defining an interior volume, a superconductor disposed in the interior volume, and a refrigeration system configured to adjust a temperature of the superconductor in response to a condition during a steady state operation of the SCFCL. A method of operating a SCFCL includes cooling a superconductor disposed within an interior volume of a cryogenic tank to a temperature less than a critical temperature of the superconductor, and adjusting the temperature of the superconductor in response to a condition during a steady state operation of the SCFCL.

14 Claims, 4 Drawing Sheets

US 8,611,056 B2

SUPERCONDUCTING FAULT CURRENT LIMITER

CROSS REFERENCE TO RELATED APPLICATIONS

This application claims the benefit of provisional patent application No. 61/452,398, filed Mar. 14, 2011, which is incorporated herein by reference.

FIELD

This disclosure relates to superconducting fault current limiters.

BACKGROUND

A superconducting fault current limiter (SCFCL) is a device that limits fault currents in a power system. The power system may include transmission and distribution networks to deliver power to differing industrial, commercial, and residential loads. A fault current is an abnormal current in the power system due to a fault such as a short circuit. A fault current may occur due to any number of events such as severe weather damaging power lines and components, e.g., lighting striking the power system. When faults occur, a large load appears instantaneously. The network, in response, delivers a large amount of current fault current) to this load or, in this case, the fault. This surge or fault current condition is undesirable since it may damage the network or equipment connected to the network.

A SCFCL includes a superconductor positioned in a cryogenic tank. The superconductor is in a superconducting state having zero resistance during normal or steady state operation. To maintain the superconductor in the superconducting state, the superconductor is operated below its critical temperature, critical current density, and critical magnetic field. If any one of these three is exceeded, the superconductor quenches from its superconducting state to a normal state and exhibits a resistance. To maintain the superconductor at a temperature below its critical temperature, a refrigeration system provides a cryogenic cooling fluid to the cryogenic tank housing the superconductor. The conventional refrigeration system strives to maintain a constant temperature of the cooling fluid sufficiently below the critical temperature of the superconductor. One drawback with this is the energy needed to maintain the selected constant temperature. Another drawback is that the fault current necessary to quench the superconductor may be excessive leading to a comparatively slower transition to quenching when a fault occurs. Therefore, the protective advantage of the SCFCL may be diminished as the peak-to-peak amplitude of the current passed during a fault condition may be higher than desired.

Accordingly, there is a need in the art for an SCFCL that overcomes the above-described inadequacies and shortcomings.

SUMMARY

According to a first aspect of the disclosure, a SCFCL is provided. The SCFCL includes a cryogenic tank defining an interior volume, a superconductor disposed in the interior volume, and a refrigeration system configured to adjust a temperature of the superconductor in response to a condition during a steady state operation of the SCFCL.

According to another aspect of the disclosure, a method of operating a SCFCL is provided. The method includes cooling a superconductor disposed within an interior volume of a cryogenic tank to a temperature less than a critical temperature of the superconductor, and adjusting the temperature of the superconductor in response to a condition during a steady state operation of the SCFCL.

According to yet another aspect of the disclosure, a SCFCL is provided. The SCFCL includes: a cryogenic tank defining an interior volume; a superconductor disposed in the interior volume; a temperature sensor configured to provide a temperature signal representative of a temperature of the superconductor; and a refrigeration system. The refrigeration system is configured to adjust the temperature of the superconductor during a steady state operation of the SCFCL to a first temperature during a first condition and to a second temperature during a second condition, the first temperature higher than the second temperature, the first temperature and the second temperature both less than a critical temperature of the superconductor, wherein a first fault current necessary to quench the superconductor during the first condition is less than a second fault current necessary to quench the superconductor during the second condition.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
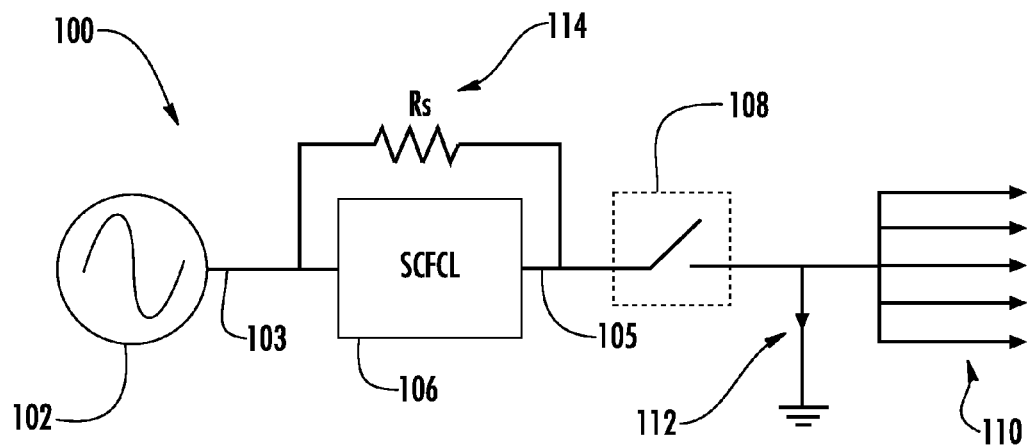
FIG. 1 is a circuit diagram of one power system having a SCFCL consistent with an embodiment of the disclosure.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a circuit diagram of one power system 100 having a SCFCL 106 consistent with an embodiment of the disclosure. This is but one simplified power system 100 and those skilled in the art will recognize may other power systems where a SCFCL 106 may be utilized. The power system 100 includes an AC power generator 102, a shunt 114 in parallel with the SCFCL 106, a circuit breaker 108 which is normally closed, and differing loads 110.

Under a steady state condition, the AC power generator 102 provides power to the loads 110. The circuit breaker 108 is closed and current flows through conductor 103, the SCFCL 106, and conductor 105 to the loads 110. During the steady state condition, the superconductor of the SCFCL 106 is in a superconducting state, exhibiting zero resistance. A fault condition may occur at location 112 as illustrated by the inadvertent path to ground. In response, the AC power generator 102 attempts to deliver a large amount of fault current. The superconductor quenches and exhibits a resistance much larger than the resistance of the shunt 114. Hence, the fault current is commutated into the shunt 114 which limits the fault current to an acceptable level by reducing the peak to peak value of the fault current before the circuit breaker 108 can open (a conventional circuit breaker 108 typically takes 2 to 3 cycles before opening at 60 Hz). During a post fault time interval, the circuit breaker 108 opens and no current is provided to the loads 110.

Figure 2:
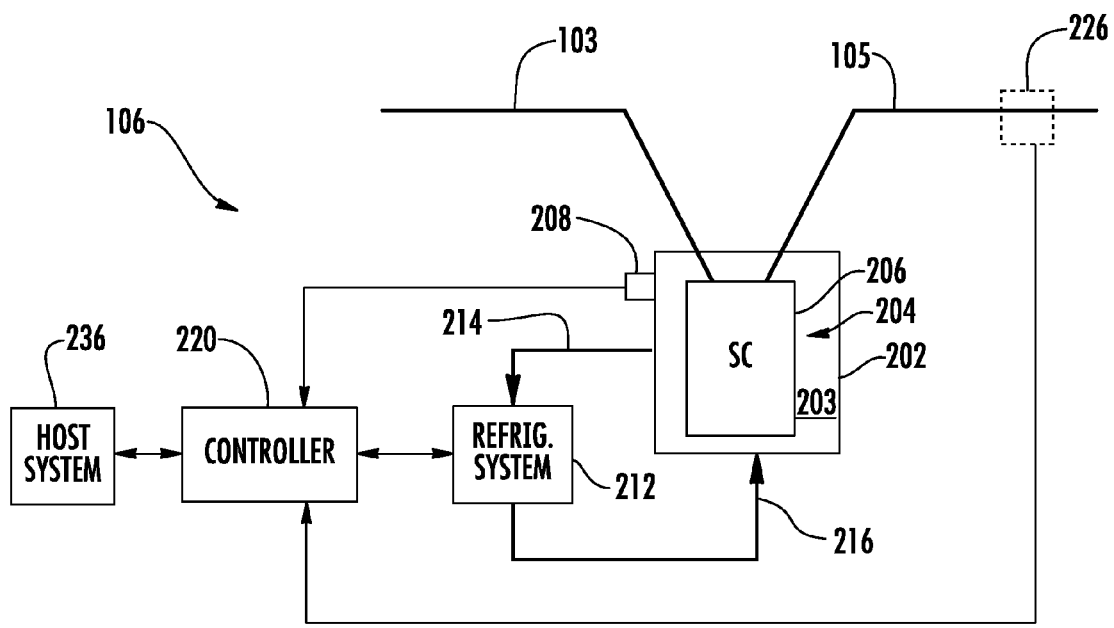
FIG. 2 is a block, diagram illustrating portions of the SCFCL of FIG. 1 in more detail.

Turning to FIG. 2, a block diagram of select portions of the SCFCL 106 are illustrated in more detail. The SCFCL 106 may include a cryogenic tank 202 defining an interior volume 203, a superconductor 206 positioned in the interior volume 203, a refrigeration system 212, a controller 220, a temperature sensor 208, and a current sensor 226. For clarity of illustration, only one SCFCL for one phase is illustrated. Those skilled in the art will recognize that there may be three SCFCLs (one for each phase) of a three phase AC power system.

The cryogenic tank 202 may be fabricated of differing materials such as dielectric materials and/or thermally insulating materials. The superconductor 206 may be fabricated of any type of superconducting material such as yttrium barium copper oxide (YBCO) that exhibits superconducting properties when held below its critical temperature, critical current density, and critical magnetic field. The superconductor 206 may include a plurality of modules depending on the amount of superconducting material required. The refrigeration system 212 is configured to provide a cryogenic liquid to the cryogenic tank 202 via a supply conduit 216 and to receive the same via a return conduit 214. The refrigeration system 212 may include a cryogenic cooling unit to cool the input cryogenic fluid received from the return conduit 214 before providing cooled cryogenic fluid back via the supply conduit 216. The refrigeration system 212 may also include valves, pumps, and sensors. The refrigeration system 212 may also include a storage tank to store additional cryogenic cooling fluid. The cryogenic cooling fluid may be liquid nitrogen, liquid helium, liquid argon, liquid neon, etc. and/or mixtures of the same.

The controller 220 can be or include a general-purpose computer or network of general-purpose computers that may be programmed to perform desired input/output functions. The controller 220 can also include other electronic circuitry or components, such as application specific integrated circuits, other hardwired or programmable electronic devices, discrete element circuits, etc. The controller 220 may also include communication devices, data storage devices, and software. The controller 220 may receive input signals from a variety of systems and components such as the temperature sensor 208 and the current sensor 226. The temperature sensor 208 is illustrated as being on the outside of the cryogenic tank 202 but may be positioned in other locations as well to monitor a temperature representative of the superconductor 206 and to provide a temperature signal representative of the same. The temperature signal may be received by the controller 220. The current sensor 226 may be positioned to monitor in real time the current usage on the conductor 105. Any type of current sensor may be utilized such as a current transformer positioned about the conductor 105. The current usage over time of the conductor 105 is representative of an actual demand profile of a circuit downstream and coupled to the SCFCL.

Figure 3:
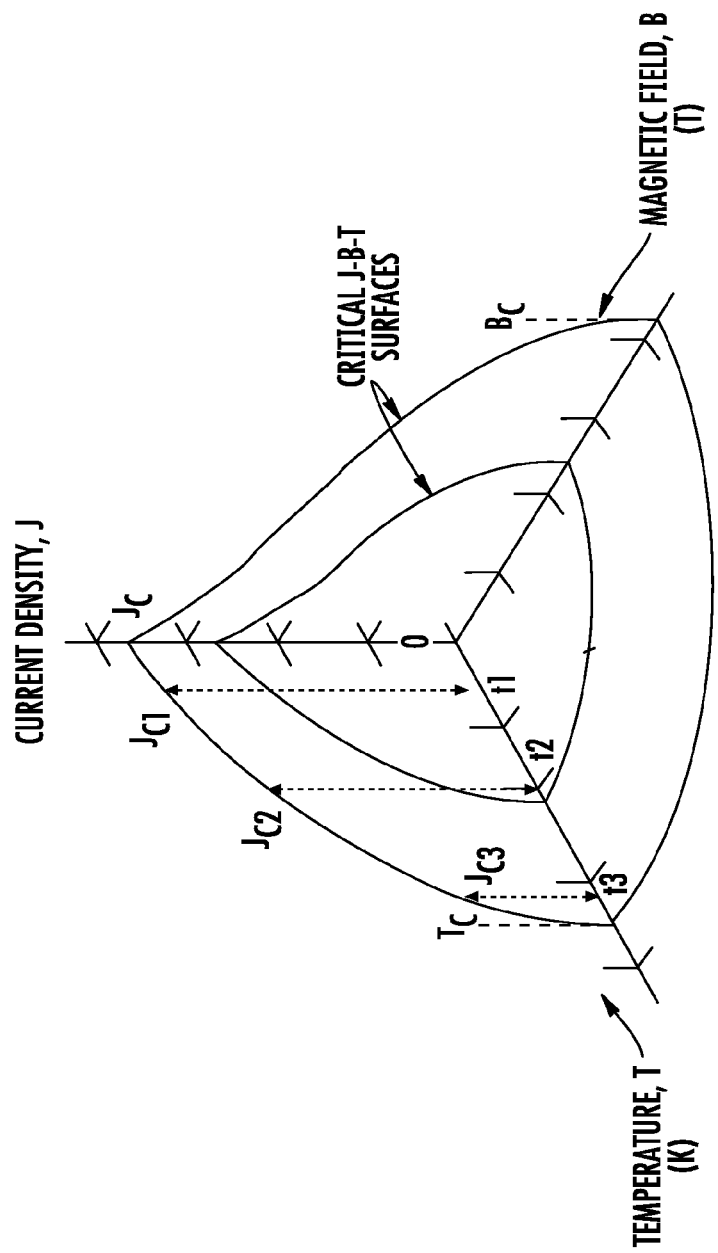
FIG. 3 is a plot of parameters that may impact quenching of the superconductor of the SCFCL.

Turning to FIG. 3 in conjunction with FIG. 2, operation of the SCFCL 106 is detailed. As illustrated by the graph of FIG. 3, the superconductor 206 of FIG. 2 will remain in a superconducting state until one of the three parameters (critical temperature, critical current density, and critical, magnetic field) is exceeded. During steady state operation of the SCFCL 106, the refrigeration system 212 may dynamically adjust the temperature of the superconductor 206 to be within a range between 0° K and its critical temperature (Tc) which may be between about 77° K and 93° K for high temperature superconductors. As illustrated in FIG. 3, dynamically controlling the temperature of the superconductor 206 varies the amount of the current density change necessary to quench the superconductor and hence the amount of fault current. For example, illustrated temperatures (t3), (t2), and (t1) are all less than the critical temperature (Tc). In addition, (t3) is greater than (t2), which is greater than (t1). If the temperature of the superconductor 206 is at temperature (t3), the change in current density ($J_{C3}$) to quench the superconductor is less than the associated change in current densities ($J_{C2}$) and ($J_{C1}$) at temperatures (t2) and (t1) respectively assuming a similar magnetic field in each instance. Accordingly, the fault current necessary to quench the superconductor 206 is less at temperature (t3) than at temperature (t2).

The refrigeration system 212 as controlled by the controller 220 may dynamically adjust the temperature of the cryogenic cooling fluid provided to the cryogenic tank 202 and hence the temperature of the superconductor 206 in response to a condition. In one embodiment, the condition may be an actual demand profile of a circuit coupled to the SCFCL as measured by the current sensor 226 over time. In another embodiment, the condition may be a projected demand profile of a circuit coupled to the SCFCL. The refrigeration system 212 may also be responsive to sensed parameters in a closed loop feedback control system. One sensed parameter may be representative of the temperature of the superconductor 206 as provided by the temperature sensor 208. Another sensed parameter may be representative of the current usage on conductor 105 as provided by the current sensor 226. The controller 220 may also communicate with a host system 236, e.g., telemetry system, to inform the host system 236 of particular operating conditions of the SCFCL including the temperature of the superconductor and an associated current density necessary for quench. The host system 236 may also have the ability to remotely control the SCFCL by communicating with the controller 220.

Figure 4:
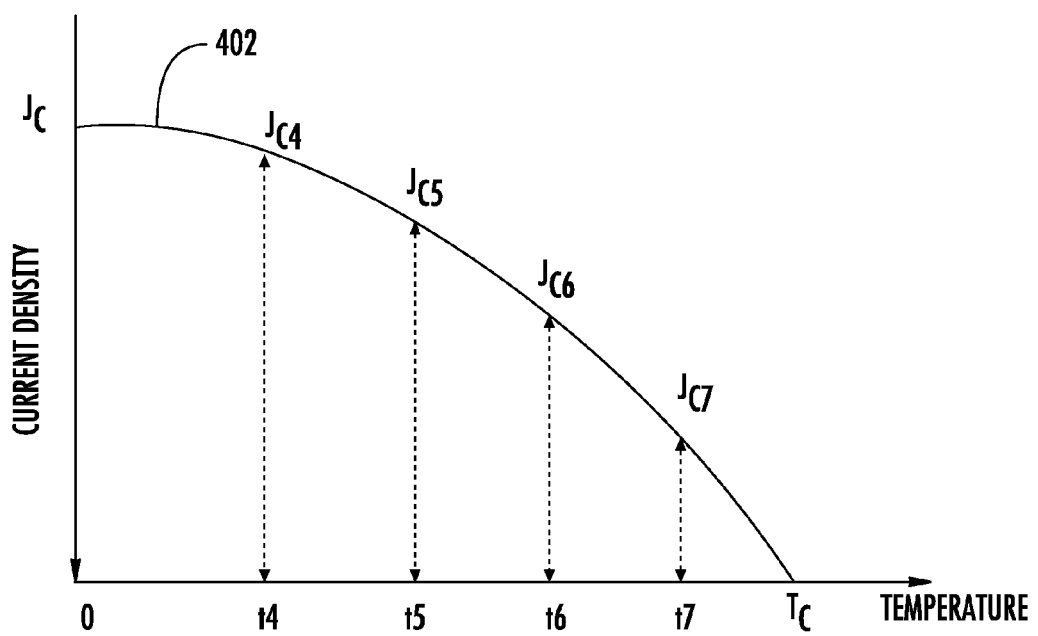
FIG. 4 is a plot of temperature of the superconductor versus current density.

Turning to FIG. 4, a two dimensional plot 402 of current density versus temperature of the superconductor 206 is illustrated assuming a constant magnetic field to illustrate the associated change in current density and therefore associated fault current necessary for quenching the superconductor 206. As illustrated, at temperature (t4), the superconductor 206 requires a change in current density ($J_{C4}$) to quench that is larger than other changes ($J_{C5}$), ($J_{C6}$), and ($J_{C7}$) at correspondingly higher temperatures approaching the critical temperature ($T_C$).

Figure 5A:
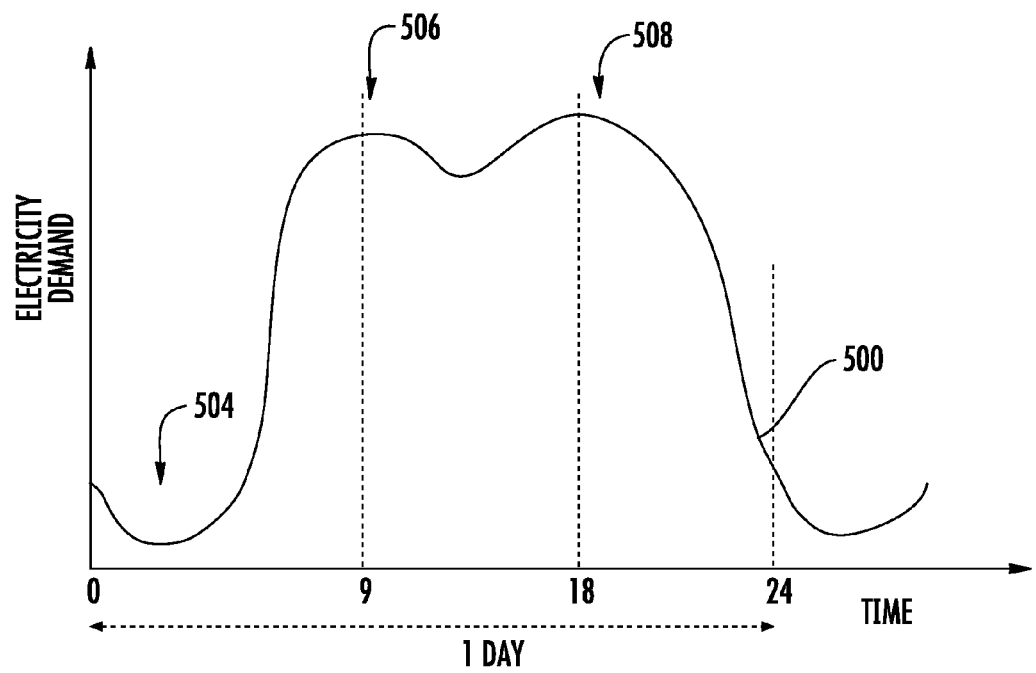
FIGS. 5A and 5B are plots of electricity demand and temperature of the superconductor versus a similar time scale.

Turning to FIG. 5A, a representative plot 500 of electricity demand versus time of a circuit coupled to the SCFCL is illustrated. The unit of electricity demand may be in watts and the unit of time is illustrated as hours from 0 (midnight) to 24 over a one day period. A first trough 504 of electricity demand during the night time reaches a comparatively lower level. As morning progresses, a first peak 506 of demand may occur at about 9 a.m. A second peak 508 of demand may occur during the evening hours at about 6 p.m. Electricity demand then decreases as consumers generally uses less energy during the night hours. The plot 500 may be referred to as a demand profile for the circuit of interest. The plot 500 is one example of many.

In one application, the SCFCL 106 may dynamically adjust the temperature of superconductor 206 in response to an actual or projected demand profile as illustrated in FIG. 5A.

The temperature of the superconductor 206 may be adjusted by the refrigeration system 212 which may adjust the temperature of the cryogenic cooling fluid provided to the cryogenic tank 202 from the supply conduit 216, the flow rate of the same, and/or the flow rate of the received cryogenic fluid from the return conduit 214.

Figure 5B:
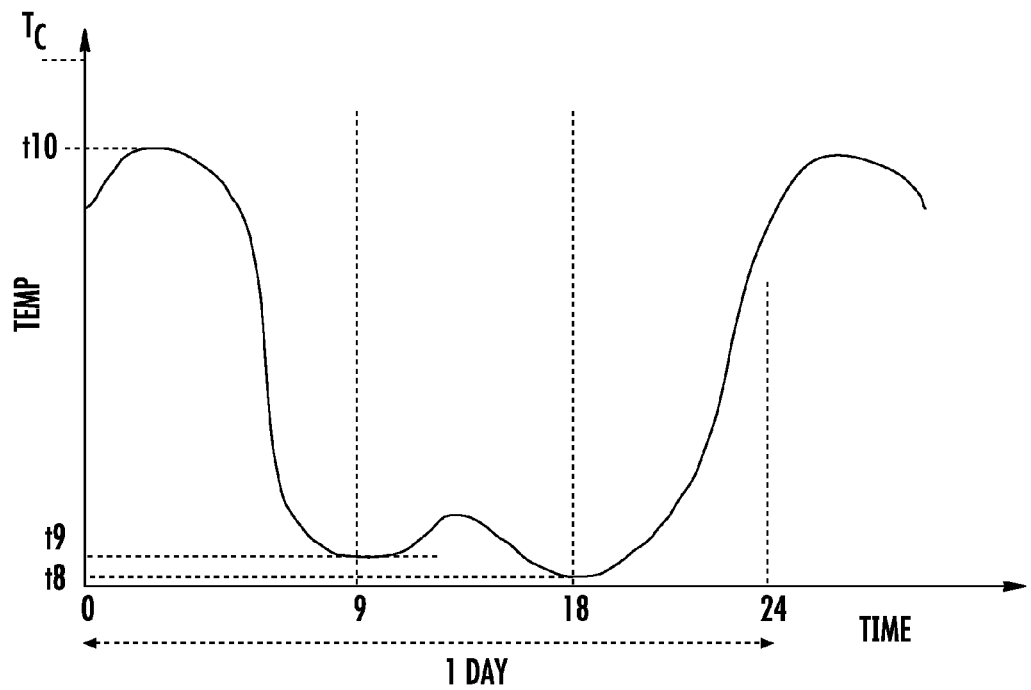

For instance, as illustrated in FIG. 5B, when electricity demand is at the first trough 504 (FIG. 5A) during the night time hours, the refrigeration system 212 may adjust the temperature of the superconductor 206 to allow the superconductor to warm to temperature (t10) slightly below the critical temperature ($T_C$). In contrast, during the first peak 506 of demand, the refrigeration system 212 may cool the temperature of the superconductor 206 down to temperature (t9), where (t9)<(t10). Similarly, at the second peak 508 of demand which is slightly higher than the first peak 506 of demand, the refrigeration system may cool the superconductor 206 down to temperature (t8), where (t8)<(t9). In one example, the critical temperature ($T_C$) may be about 85° K and the temperature (t10) may be 50° K<temperature (t10) <85° K. The temperature (t9) may be less than 40° K.

In a system without this dynamic mechanism, the temperature of the superconductor 206 would have to be maintained at a temperature (t)<(t8). This would require a larger fault current to contribute to the larger change in current density required to quench the superconductor 206. This would also require additional time to elapse before the superconductor is quenched and hence the fault current limited. Additionally, by avoiding the need to continually cool to such a low temperature (t)<(t8) at all times, efficiency gains are realized since less energy is necessary to cool the superconductor and there is reduced wear on the SCFCL system.

There has thus been provided a SCFCL having a cryogenic tank defining an interior volume, a superconductor disposed in the interior volume, and a refrigeration system configured to adjust a temperature of the superconductor in response to a condition during a steady state operation of the SCFCL. The temperature of the superconductor may be adjusted during the steady state condition when there is no fault current experienced by the power system. The condition may be an actual or projected electricity demand profile. An actual demand profile may be measured by the current sensor 226. A projected demand profile may be developed from a history of demand profiles over various times and conditions which is stored and analyzed. Such a SCFCL may save energy by enabling the cryogenic cooling fluid to be warmer than otherwise during certain steady state times. For example, during actual or projected light load conditions, the cryogenic cooling fluid may be warmer than during actual or projected heavier load conditions. In addition, the SCFCL may also provide for a faster quench of the superconductor in response a fault condition since a relatively smaller change in fault current is necessary to quench the superconductor when the superconductor is kept at a relatively warmer temperature. Accordingly, the protective advantages of the SCFCL in limiting the peak-to-peak amplitude of the current passed during a fault condition may also be improved compared to a conventional SCFCL that maintains the cryogenic cooling fluid at a static lower temperature.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A superconducting fault current limiter (SCFCL) comprising:
    a cryogenic tank defining an interior volume;
    a superconductor disposed in the interior volume;
    a refrigeration system configured to adjust a temperature of the superconductor in response to a condition during a steady state operation of the SCFCL, and
    a temperature sensor configured to provide a temperature signal representative of the temperature of the superconductor, wherein the refrigeration system is responsive to the temperature signal to adjust a temperature of a cryogenic cooling fluid provided through a supply conduit to the cryogenic tank to adjust the temperature of the superconductor.

2. The SCFCL of claim 1, wherein the condition comprises an actual demand profile of a circuit coupled to the SCFCL.

3. The SCFCL of claim 1, wherein the condition comprises a projected demand profile of a circuit coupled to the SCFCL.

4. The SCFCL of claim 1, wherein the refrigeration system is further configured to adjust the temperature of the superconductor to a first temperature during a first condition and to a second temperature during a second condition, the first temperature higher than the second temperature, the first temperature and the second temperature both less than a critical temperature of the superconductor, wherein a first fault current necessary to quench the superconductor during the first condition is less than a second fault current necessary to quench the superconductor during the second condition.

5. The SCFL of claim 4, wherein the first condition is representative a first power demand on a circuit coupled to the SCFCL and the second condition is representative of second power demand on the circuit, the first power demand less than the second power demand.

6. The SCFCL of claim 4, wherein the first temperature is greater than 50° K but less than the critical temperature, and the second temperature is less than 40° K.

7. A method of operating a superconducting fault current limiter (SCFCL) comprising:
    cooling a superconductor disposed within an interior volume of a cryogenic tank to temperature less than a critical temperature of the superconductor;
    adjusting the temperature of the superconductor in response to a condition during a steady state operation of the SCFCL;
    adjusting the temperature of the superconductor to a first temperature during a first condition; and
    adjusting the temperature of the superconductor to a second temperature during a second condition, the first temperature and the second temperature both less than the critical temperature, wherein a first fault current necessary to quench the superconductor during the first condition is less than a second fault current necessary to quench the superconductor during the second condition.

8. The method of claim 7, wherein the condition comprises an actual demand profile of a circuit coupled to the SCFCL.

9. The method of claim 7, wherein the condition comprises a projected demand profile of a circuit coupled to the SCFCL.

10. The method of claim 7, further comprising:
    providing a cryogenic cooling fluid to the cryogenic tank; and adjusting a temperature of the cryogenic fluid provided to the cryogenic tank to adjust the temperature of the superconductor.

11. The method of claim 7, wherein the first condition is representative a first power demand on a circuit coupled to the SCFCL and the second condition is representative of second power demand on the circuit, the first power demand less than the second power demand.

12. The method of claim 11, wherein the first temperature is greater than 50° K but less than the critical temperature, and the second temperature is less than 40° K.

13. A superconducting fault current limiter (SCFCL) comprising:
- a cryogenic tank defining an interior volume;
- a superconductor disposed in the interior volume;
- a temperature sensor configured to provide a temperature signal representative of a temperature of the superconductor; and
- a refrigeration system configured to adjust the temperature of the superconductor during a steady state operation of the SCFCL to a first temperature during a first condition and to a second temperature during a second condition, the first temperature higher than the second temperature, the first temperature and the second temperature both less than a critical temperature of the superconductor, wherein a first fault current necessary to quench the superconductor during the first condition is less than a second fault current necessary to quench the superconductor during the second condition.

14. The SCFL of claim 13, wherein the first condition is representative a first power demand on a circuit coupled to the SCFCL and the second condition is representative of second power demand on the circuit, the first power demand less than the second power demand.

* * * * *